United States Patent [19]
Proskauer

[11] Patent Number: 5,828,674
[45] Date of Patent: Oct. 27, 1998

[54] PRODUCTION INTERFACE FOR INTEGRATED CIRCUIT TEST SYSTEM

[75] Inventor: Daniel C. Proskauer, Newton, Mass.

[73] Assignee: Teradyne, Inc., Boston, Mass.

[21] Appl. No.: 931,793

[22] Filed: Sep. 16, 1997

[51] Int. Cl.$^6$ ................................................. G06F 11/00
[52] U.S. Cl. ............................................................... 371/22.1
[58] Field of Search ...................... 371/22.1; 395/200.47, 395/200.33, 200.46, 183.08, 183.11, 183.14, 183.13

[56] References Cited

U.S. PATENT DOCUMENTS 5,764,908   6/1998   Shoji et al. ............................... 395/200

OTHER PUBLICATIONS

A585/A575/A565 Series Advanced Mixed–Signal Test: System Description, *IMAGE Software System*, p. 32.
IMAGE ExPress Code–Producing Displays, *CATD Software for the A500 Family* of Test Systems, Teradyne, 1991, pp. 6–9.
*J900 VEX Database Reference Manual*, Revision A, Teradyne, Feb. 1997, pp. 1–48.

*Primary Examiner*—Vincent P. Canney
*Attorney, Agent, or Firm*—Edmund J. Walsh

[57] ABSTRACT

A production operator interface is created using self-contained ActiveX controls each of which provide an interface to a specific part of the overall test system. These controls all communicate among themselves automatically. The production interface uses an ActiveX "tester control" which provides an application programming interface to the rest of the software control system. A library of self-contained ActiveX controls is provided which contains "operator controls" which may be "dragged and dropped" into an operator window to provide the operator with information and the ability to control the test system. In addition a semiconductor test system needs to be adapted to work with one or more different packaged device handlers or wafer probers which position a semiconductor device for testing by the tester. An ActiveX operator control allows an operator to select a handler driver from a library of handler drivers.

23 Claims, 3 Drawing Sheets

PRODUCTION INTERFACE FOR INTEGRATED CIRCUIT TEST SYSTEM

BACKGROUND IF THE INVENTION

1. Field of the Invention

This invention relates generally to automatic test equipment used in the manufacture of semiconductors and more specifically to the production interface and handler drivers of the test system.

2. Description of the Related Art

Automatic test equipment is widely used in the manufacture of semiconductors. Semiconductors are generally tested at least once during their manufacture and are sometimes tested at more than one step in the manufacturing process. Because every component is tested, speed of testing is critical to the economic manufacture of semiconductors. Slow testing prevents full utilization of the expensive capital equipment needed to produce semiconductor components. Modern semiconductor components are very complicated and have many operating states. Each of these operating states must be exercised to perform a complete test. Automatic test equipment is therefore designed to apply test data to a semiconductor device and make numerous measurements very quickly in a production setting.

FIG. 1 shows a generalized automatic test system of the prior art. To provide thorough and fast testing, the automatic test system generally includes a tester body 112, a computerized work station 110 and a handling device 114. The computer work station 110 controls both the handling device 114 and the tester body 112. It controls the handling device 114 to position the semiconductor device (not shown) where it makes contacts with numerous test probes 118 on the tester body 112. Often, a tester will include a separate test head containing test probes 118. However, such a distinction is not important for the invention.

Workstation 110 then controls tester body 112 to run a series of tests on the device under test. Each test generally includes a setup portion in which control signals are sent from the work station 110 to the tester body 112. The control signals are usually digital values sent over bus 116. These control signals configure the hardware within tester body 112 to make the measurements required for the test. The hardware within the tester body provides stimulus and measures responses from the device under test in accordance with the control signals.

FIG. 1 shows that the hardware within tester body 112 includes numerous circuits identified as pins 124. Each pin 124 generates signals or makes measurements for one of the test probes 118. Each pin might provide or measure a static, or DC, signal. Alternatively, each pin 124 might provide or measure changing data in what is sometimes called a "burst".

During a burst, tester body 120 is controlled by timing and sequencing circuit 120. Timing and sequencing circuit 120 causes each of the pins 124 to read a sequence of data values from an associated memory 128. Each data value indicates the type of signal the pin should apply or expect to measure at its associated test probe 118 at a specific point in time. If the pin compares a measurement to an expected value, the results might also be stored in memory 128.

The set of data values that define the values all the pins 124 should provide or expect to measure at one time is called a "vector." During a burst, many vectors are executed. The vectors must be executed at a very high rate to simulate actual operating conditions of the device under test. There are usually millions of vectors to define the bursts needed to test a semiconductor device. The vectors are typically loaded into memories 128 at the time test system is programmed to test a particular type of part. This loading process might take several minutes and is not repeated for each burst. Rather, for each burst, work station 110 sends commands indicating which vectors are to be executed as part of the burst. Once the burst is completed, work station 110 reads the results of the burst from memory 128 or timing and sequencing circuit 120.

In addition, tester body 112 includes one or more instruments 126. An instrument performs a specific test function. It might for example generate a specific test signal such as a sine wave. Alternatively, an instrument might sample a signal at a high rate so that it can later be analyzed by a digital signal processor. These functions might be performed as part of a burst or might be performed separate from a burst.

A full test of a part, sometimes called a "job", will consist of a series of bursts interspersed with DC measurements or measurements by instruments 126. The bursts might be used to measure specific functional attributes of the device under test. Alternatively, each burst might be used only to place the device under test into a state in which a DC measurement can be taken. The order in which these elements of a test are performed, sometimes called the "flow," is dictated by software in workstation 110.

Once a device has been fully tested, or tested to the point where it is determined to be defective, work station 110 generates control signals to the handling device 114. Handling device 114 then presents the next device to be tested to tester body 112 and the process is repeated. Work-station 110 also gathers data about whether particular devices passed or failed. It can process this data so that defective devices are discarded or it can perform other functions, such as analyzing the data for failure trends.

For production it is highly desirable that the software that allows an operator to control the tester be very easy to learn and use. What is needed in a production test environment, is a very simple operator interface interface to the rest of the test system. In addition the interface must be flexible and easy to change because of the many varied requirements of this interface from customer to customer.

SUMMARY OF THE INVENTION

The present invention provides a method to create a simple operator interface to the test system that is very flexible. A production operator interface is created using self-contained ActiveX controls each of which provide an interface to a specific part of the overall test system. These controls all communicate among themselves automatically. The production interface uses an ActiveX "tester control" which provides an application programming interface to the rest of the software control system. A library of self-contained ActiveX controls is provided which contains "operator controls" which may be "dragged and dropped" into an operator window to provide the operator with information and the ability to control the test system. The ActiveX operator controls interface through the ActiveX tester control to the rest of the test system.

In addition a semiconductor test system needs to be adapted to work with one or more different packaged device handlers or wafer probers which position a semiconductor device for testing by the tester. An ActiveX operator control allows an operator to select a handler driver from a library of handler drivers. Each handler driver uses an ActiveX handler tester control which serves as the interface between the handler and the ActiveX tester control (and thus to the rest of the test system).

DETAILED DESCRIPTION OF THE INVENTION

Figure 2:
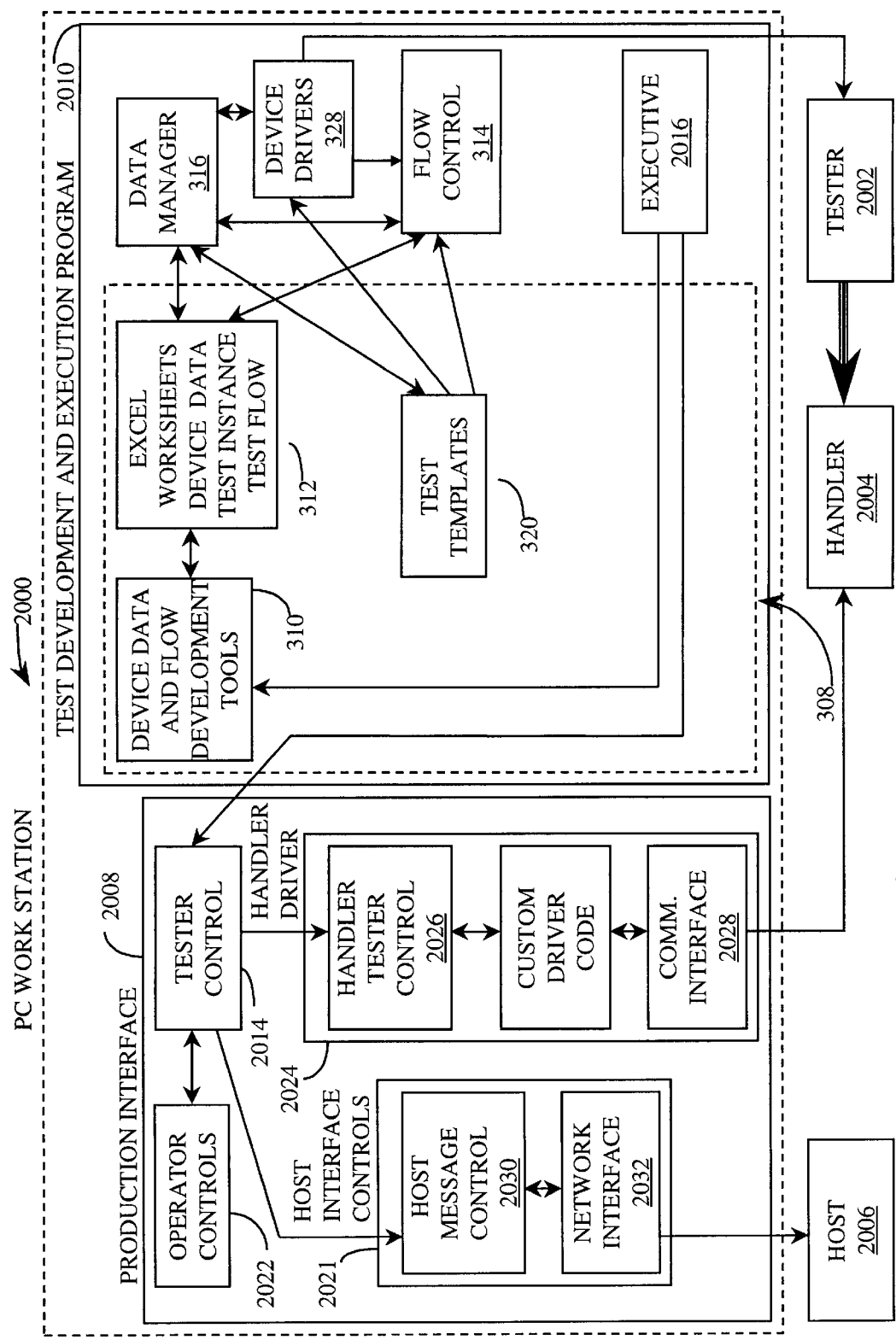
FIG. 2 is a functional block diagram of the Production Interface of the present invention.

FIG. 2 is a detailed functional block diagram of the complete test system of the present invention. The system includes a PC workstation 2000, tester 2002, a handler 2004, and a host 2006. The software of workstation 2000 is made up of a production interface 2008 and test development and execution program 2010 (generically called a software control system).

Production interface 2008, serves as the interface between the operator and test development and execution program 2010, host 2006 and handler 2004. To control this equipment in a production test environment, it is necessary to provide a very simple control interface to the equipment operator. However, there are many varied requirements of this interface from customer to customer and even site to site within the same customer. In addition, the test equipment must often interface to other computer control systems with a variety of requirements. Providing an interface that is simple yet flexible, which meets the requirements of all users, and can be interfaced to other computer control programs has been a very difficult problem. This was all previously programmed in C/C++.

Production interface 2008 solves the problem through the use of self contained control objects hereinafter called self contained "controls" each of which provides an interface to a specific part of the overall test system including test development and execution program 2010, host 2006, and handler drivers 2024. These controls all communicate among themselves automatically.

In the preferred embodiment, these controls are "ActiveX" controls written in Visual Basic (hereinafter VB) from Microsoft Corporation of Redmond, Wash. These controls can be combined quickly and easily into a graphical user interface (GUI) using Visual Basic or can be used as a programmatic interface without a GUI. The Active X controls allow the operator to initiate an action in test development and execution program 2010, host 2000, or handler 2004. The operator during production testing uses an active X control to communicate with executive 2016. In addition, the operator may initiate accompanying actions by the handler 2004 and the host 2006 or the production interface may automatically initiate action in test development and execution program 2010 (through executive 2016) in response to requests from Handler 2004 or Host 2006.

An ActiveX control interface is defined by properties, events, and methods. A method is a Visual Basic function that may be called in the control. The function can take arguments and return a value, and is analogous to a function definition in a C/C++ library. A property is basically a global variable in the control, with access functions provided to get and/or set its value. Properties can be made programmable at design time or run time, and VB automatically handles saving programmed property values as part of the production interface executable. An event is a signal initiated by the control that is passed to the object containing the control. The container (the production interface in the preferred embodiment) can include a handler for the event if it is needed.

There are four types of ActiveX controls in the preferred embodiment:

Tester Control 2014. This provides an application programming interface (API) to the rest of the system.

Operator controls 2022. These are GUI components that allow an operator at the tester console to perform actions or view status.

Handler Tester Control 2026. This is an ActiveX control that defines the interface to any handler 2004. This serves as the single connection point between the handler driver 2024 and the Tester Control 2014 of the production interface. Anything containing this control can be used as a handler driver 2024 by production interface 2008.

Host interface control 2021. This control translates the Tester Control 2014 API into standard messages sent to or received from host 2006.

The term production controls refers to all ActiveX controls used to create a production operator interface and/or handler driver. This includes the tester control, operator controls, handler tester control and host interface controls.

To operate the tester in a semiconductor production environment there needs to be a variety of windows available that the operator may bring up on his display depending on the test to be performed. To create these windows the programmer can "drag and drop" controls from a library of ActiveX controls onto the operator window. ActiveX controls are designed to be self-contained so that they may be dragged and dropped into any application. The term "drag and drop" is used generically to refer to the act of selecting an object and placing that object into a container. The term container is used generically to refer to an entity that can contain other objects. In the preferred embodiment the container is the operator window and the objects are ActiveX controls. The advantage is the simplicity with which the different windows at the operator interface may be created. Previously, all such forms needed to be individually programmed in C/C++ which was difficult and time consuming. It is a completely novel application to use ActiveX controls for operator controls in semiconductor testing.

Another advantage is the manner in which the ActiveX controls on a specific window at the operator station all talk to each other. Each ActiveX control is designed to operate such that at the time of initialization each operator control will search for other operator controls and the tester control in the window and establish a communication link to every other ActiveX control such that each control can talk to each other control.

Figure 3:
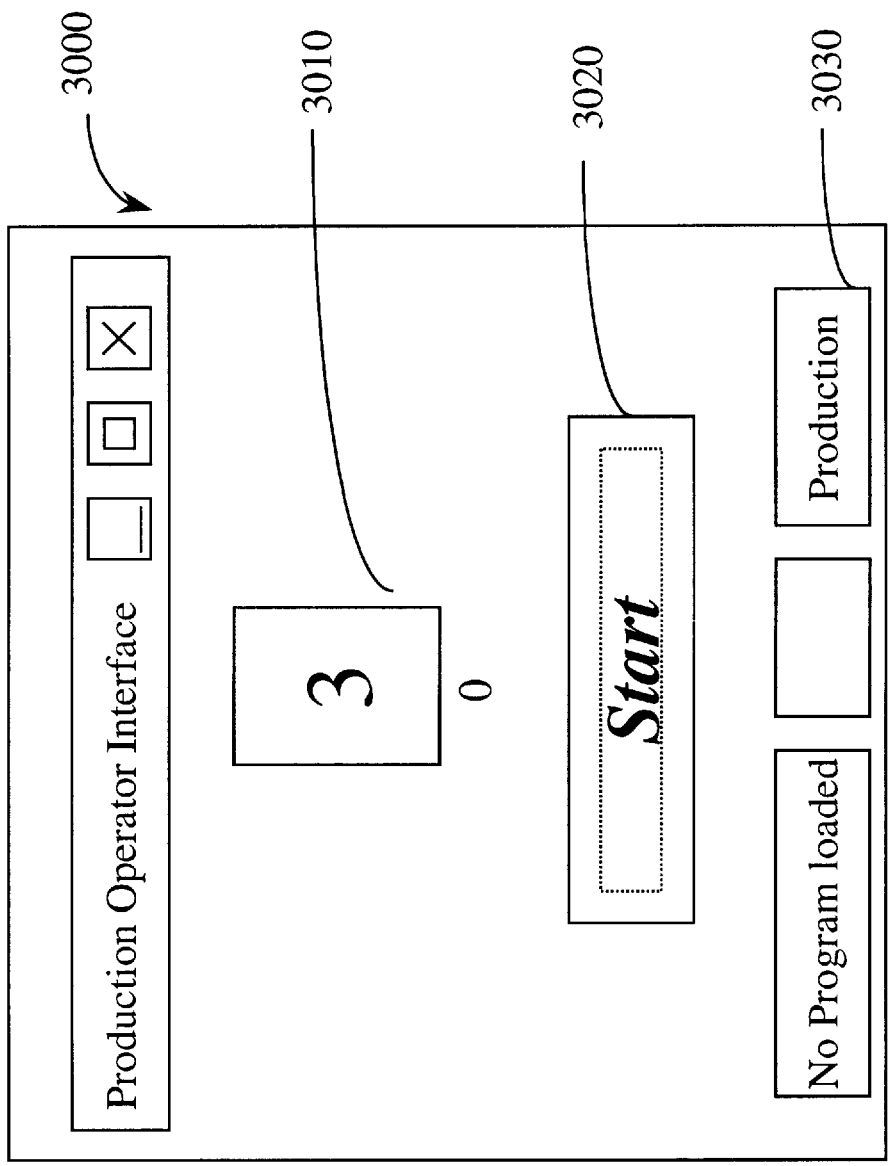
FIG. 3 is an example of a very simple Production Operator Interface.

To further illustrate, an example production operator interface is shown in FIG. 3. Operator Interface 3000 contains a tester control 3030, a bin display 3010, and a start button 3020. The bin display and start button are examples of operator controls. An example of the search routine is that used to identify all bin displays in the window is given below. The method used is to iterate through all controls in the parent window looking for controls of type "BinDisplay". When a bin display is found, an object handle for that control is saved for future communication with the bin displays. This search routine was difficult to determine and the following program written in visual basic is the best mode known for the search.

```
Note 1:  This routine currently looks up exactly one level, it
         should be extended to walk through an arbitrary number of
         levels.

Note 2:  This routine is called whenever communication with a bin
         display is needed (see note 3). Since the number of
         controls cannot change at run time (see note 4), for
         optimizes, if bin displays have already been found,
         the routine simply exits.

Note 3:  This routine is called multiple times because there is not
         an appropriate initialization event for the user control
         when it can be called. Neither UserControl_Initialize or
         UserControl_InitProperties works for different reasons.
         This should be corrected when possible.

Note 4:  Controls can actually be added at run time. We are assuming
         that this will not happen. This may not strictly be a safe
         assumption.
    Private Sub BinDisplayInit( )
Dim thisControl As Object If Not IsEmpty(BinDisplayHandleSet) Then Exit Sub
  BinDisplayHandleSet = True
  FoundBinDisplays = False For Each thisControl In UserControl.Parent.Controls
    If TypeOf thisControl is BinDisplay Then
      If FoundBinDisplays Then
        ReDim Preserve BinDisplayHandle(UBound(BinDisplayHandle) –
          LBound(BinDisplayHandle) + 1)
      Else
        ReDim BinDisplayHandle(1)
        FoundBinDisplays = True
      End If
      Set BinDisplayHandle(UBound(BinDisplayHandle)) = thisControl
    End if
  Next thisControl
End Sub
```

As an example of how the ActiveX controls communicate with each other, when the operator wishes to initiate a test he will use an ActiveX start control in operator controls 2022. The start control is programmed to communicate with a method in the ActiveX tester control 2014 that will initiate the start of the test by the executive 2016. The test program will run and a result will be available. The test development and execution program 2010 will send back an indication that the test is complete. The tester control 2014 will request the results of the test from executive 2016. The tester control 2014 next will inform any bin displays of the test results.

All of the ActiveX controls in the operator interface communicate to the rest of the test system through the ActiveX tester control. There is only one tester control 2014.

The operator controls 2022 also have an ActiveX handler control that lets an operator select a handler from a menu of available handler drivers, connect it, and enable it. The term handlers is used generically to refer to packaged device handlers or wafer probers. The design of handler drivers 2024 is a major departure from what was done in the prior art. The handler support for these prior art testers consists of a single, highly configurable library that attempts to support all possible equipment. This has proved to be difficult for customers to use. Configuring any particular piece of equipment is complicated because the interface has many programmable settings, only some of which are necessary. If a new handler requires a feature not available in the library, a system software update is required which the end customer can't do. And the library is bug-prone, since any change to support new handlers risks introducing bugs in preexisting ones.

In the preferred embodiment each handler has its own driver, containing only the code necessary to operate that specific handler. At run time, the driver required to operate the handler in use is dynamically loaded into the production interface. This has important advantages over the prior art approach:

Since each driver module has only the code it requires, it is much smaller and simpler.

The Visual Basic environment makes it easy for the field organization or customers themselves to create a new driver without requiring support from the factory software group. The preferred embodiment includes a number of drivers which can be copied as starting points.

There is little risk that software development for the invention will cause bugs, unlike with a single library which must be continually changed to add new features.

The preferred embodiment will provide a library of handler drivers which customers can either use directly or as a base for developing a new driver. To develop a new driver, the usual start is to copy one of the preferred embodiment's drivers. The driver consists of a VB form that contains, at a minimum, a Handler Tester Control 2026 and calls to a communications interface 2028. The Handler Tester Control 2026 defines the interface to the handler 2004. User-defined code uses the control's properties, events, and methods and also programs the handler appropriately through the communications interface 2028.

More specifically, the Handler Tester Control 2026 is an ActiveX control that defines the interface to any handler 2004. This serves as the single connection point between the handler driver 2024 and the rest of the production interface 2008. Anything containing this control can be used by production interface 2008 as a handler driver 2024.

The communications interface 2028 defines the network transport layer between the Tester Control 2014 and any peripheral. The handler driver 2024 uses one or more communication interfaces 2028 to do actual reads and writes to and from the handler or prober 2004.

Production interface 2008 also has an ActiveX host interface control 2021 that allows the operator to connect the host 2006 to the tester 2002. On the production floor, a tester 2002 is smetimes connected to a host 2006 that monitors tester status, collects test results, and can control the testing process directly.

The Host interface control 2021 translates the Tester Control 2014 API into standard messages sent to or received from host 2006. There are two parts to the host interface control 2021. The Host Message Control 2030 is responsible for translating the Tester Control 2014 API into messages in a standard format that can be understood by the host. The Network Interface 2032 does the actual network communication with the host machine.

The Host Message Control 2030 is an ActiveX control which listens to the Tester Control 2014 events and can execute its properties and methods. When a Tester Control 2014 event is received that requires a message to the host 2006, it produces a host message describing the event and raises a "message ready" event. When a message is received from the host 2006 via a "message received" method, it accesses the appropriate Tester Control methods and properties to implement the request. The network interface 2032 is handled by code in the production interface which interacts with the host message control.

Test development and execution program 2010 operates within the Windows NT operating system and is made up of software divided into elements that are used 1) at test development and analysis time and 2) at test execution time.

Excel workbook 308 is the portion of the program used to develop tests during test development and analysis time. Excel is a spreadsheet program that allows an application to be developed. Visual Basic is a programming language built into Excel that is used to write test templates and to control execution of tests.

In the preferred embodiment the device data development and flow development tools 310 are implemented by customized spreadsheets within the Excel workbook 308. Three types of data need to be specified by the spreadsheets for a test: device data, test flow data, and test instance data. For device data these may be spreadsheets for time sets, channel maps, edge sets or a pinmap. Each of these spreadsheets is a dataset. The test instance data spreadsheets specify the test template and its associated device data set. A test template is a test algorithm. In the preferred embodiment, test templates are written in Visual Basic. A test template and its associated data set is called an "instance". Test flow data may be spread sheets specifying a series of test steps that are to be executed. The series of test steps may be the execution of a series of test templates each using an associated device data set.

Summarizing, the Excel spreadsheet information 312 includes the device data sets, the test instance information which defines which templates are to be used with the associated data set, and the test flow information defining the sequence of test instances to be executed.

Test Templates 320 are written in Visual Basic and are normally provided by the manufacturer. The data device and flow development tools 310, Excel worksheets 312 and manufacturer provided test templates 320 are used during test development and analysis time prior to the time of test execution during production testing. Test templates 320 and Excel worksheets 312 are used also during production testing.

The additional software of test development and execution program 2010 that is used at test execution time during production testing is the executive 2016, flow control software 314, data manager 316, and device drivers 328. All of this software works in the Windows NT operating system environment.

In the preferred embodiment, the tester control 2014 initiates the loading of the test program. Excel is started and the workbook 308 is opened up. The data from worksheets 312 go to data manager 316. The executive 2016 responds to tester control 2014 and calls flow control 314 and instrument drivers 328. They request data from the data manager 316. The test is now ready to go and the all functions assume an idle state. When the test program is ready to run, the tester control tells the executive 2016 to initiate the test. The executive tells flow control 314 to execute the program. The flow control determines which instance to execute and calls a template from template library 320. The template requests the device data (i.e. arguments) from the data manager 316 and then calls the drivers 328.

Device drivers 328 provide the signals to tester 2002 to perform a full test or "job" on a device under test (DUT). The full test will include DC level, functional, and serial/scan testing of the DUT. The tester may be any state of the art tester for a semiconductor. An example of a tester is given in U.S. Pat. No. 5,606,568, assigned to the same assignee Teradyne, which is hereby incorporated by reference.

After tester 2002 finishes the test the template determines whether the test passes or fails and returns control to the flow control 314. The flow control then determines if more instances need to be executed or whether the flow is done. If the flow is done then the test system enters an idle state.

The Test Development and Execution Module 2010 is more fully disclosed in a co-pending patent application, assigned to the same assignee Teradyne, entitled "LOW COST, EASY TO USE AUTOMATIC TEST SYSTEM SOFTWARE" to Daniel C. Proskauer and Predeep B. Deshpande, filed on Jun. 13, 1997 and assigned Ser. No. 08/874,615, which is hereby incorporated by reference.

Additional details of the production interface 2008, handler drivers 2024, and host interface control 2022 are provided in the following APPENDIX A.

All rights including copyrights in the material contained in APPENDIX A are vested in and the property of Teradyne, the assignee of the present invention. Teradyne retains and reserves all rights in APPENDIX A and grants permission to reproduce the material only in connection with reproduction of the granted patent and for no other purpose.

While the preferred embodiments of the invention have been shown and described, numerous variations and alternative embodiments will occur to those skilled in the art. Accordingly, it is intended that the invention be limited only in terms of the appended claims.

APPENDIX A

IG-XL Production Software

CONTENTS

1. INTRODUCTION  1

1.1. Architectural Overview
    1.2. Open Design Concept
    1.3. ActiveX Controls

2. TESTER CONTROL  4

3. OPERATOR CONTROLS  6

3.1. Handler Control
    3.2. Sites Control
    3.3. Bin Display Control
    3.4. Start Button Control
    3.5. Yield Monitor Control

4. HANDLER DRIVERS  8

4.1. Driver Model
    4.2. Built-In Drivers
    4.3. Developing a Driver
    4.4. Handler Driver Wizard
    4.5. Testing a Driver

5. HOST INTERFACE 13

5.1. Host Message Control
    5.2. Network Interface

6. PROJECT LIST  15

IG-XL Production Software                                      September 15, 1997

IG-XL Production Software

Revision History

16 Jun 97   Jon Vollmar: Added ActiveX, Host Control sections.
14 May 97   Jon Vollmar: First version, based on Ed's "Aurora Production Software"

Related Documents

"Aurora Production Software", Ed Gilbert, 8/2/96
\\aurorant\aurora\Documents\Production_SW\ProposalProductionSoftware.doc

INTRODUCTION
Architectural Overview

Figure 1:
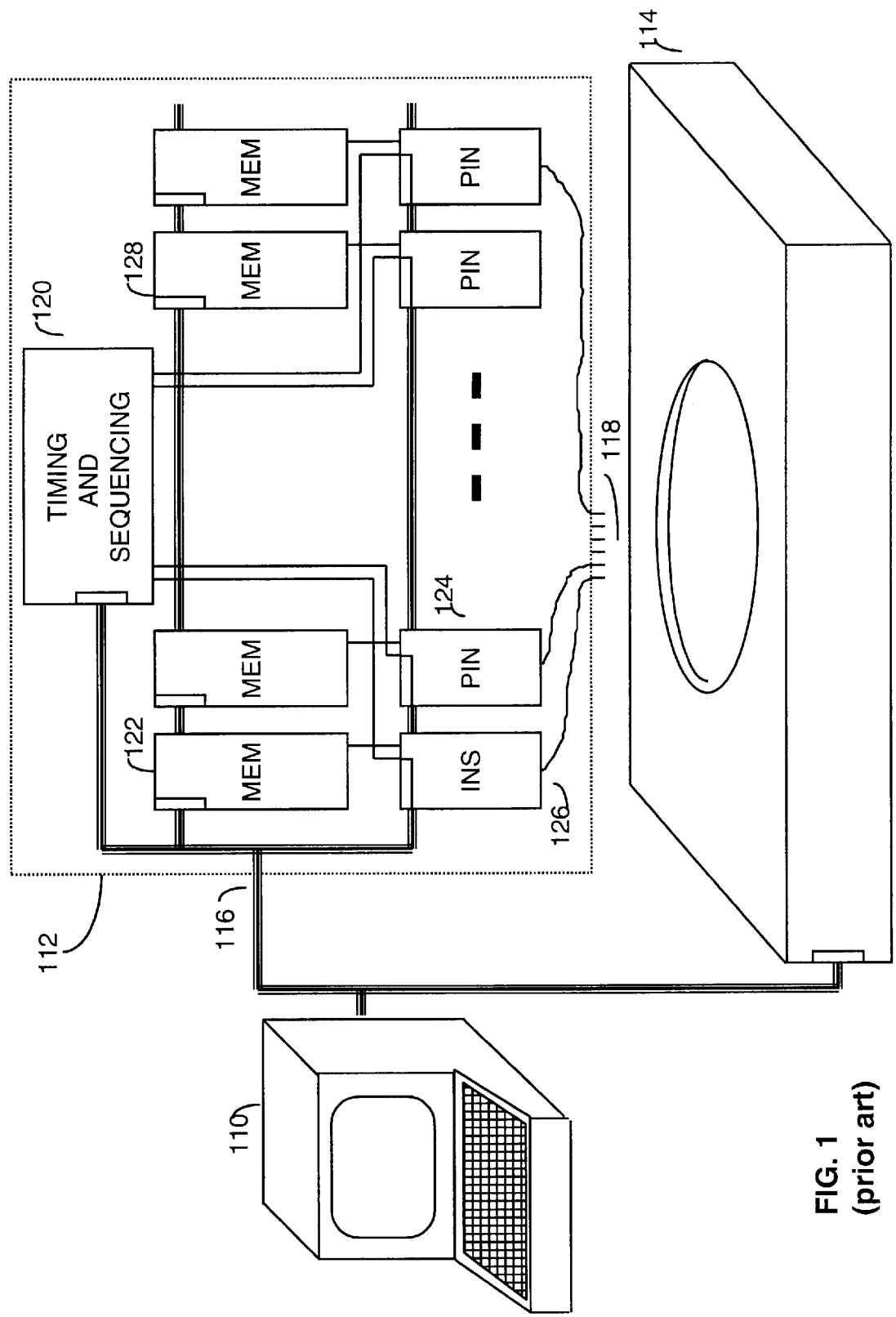
FIG. 1 is a hardware block diagram of a prior art tester.

This document describes the production software of IG-XL. As shown in figure 1, production testing requires four physical components. The tester itself consists of a PC running IG-XL and its associated test hardware. A handler inserts devices for testing and bins them based on test results (note that throughout this document, "handler" should be read as "handler or prober"). Finally, the tester is usually connected to a host (server) which collects and stores test results, and may control the testing process directly. In the latter case the host is often called a Cell Controller.

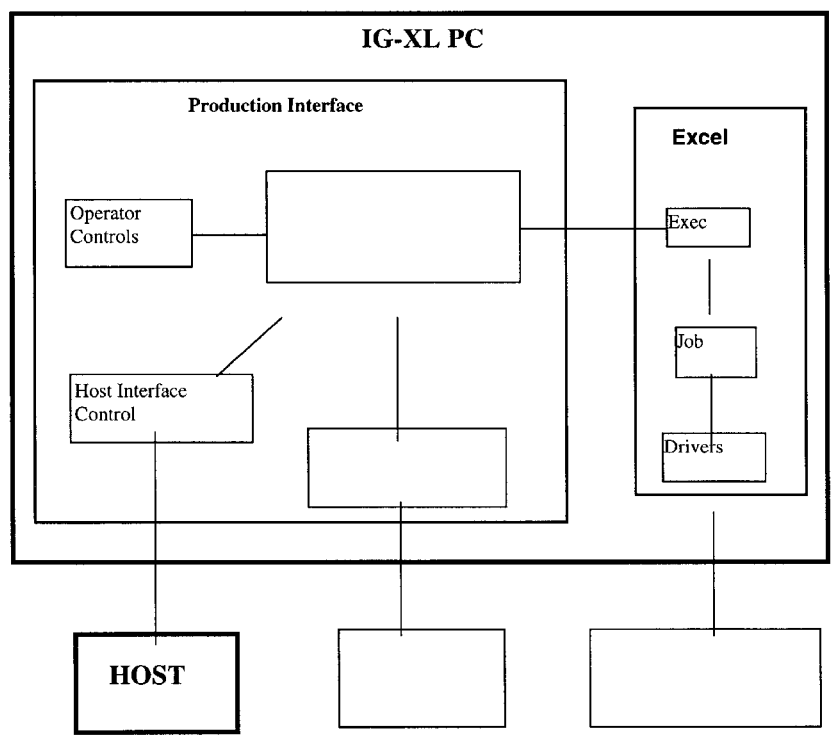

*Figure 1: IG-XL Production Software*

Within IG-XL, there are two Windows NT processes. Microsoft Excel is the interface for loading, running, and debugging the program. During production, Excel still performs these functions, although there is no visible window unless the operator enters engineering mode.

A second process provides the production interface. This is an executable written in Microsoft Visual Basic. It is made of building blocks called ActiveX controls which are included with IG-XL. There are three types of controls:

- The Tester Control. This provides an API to the IG-XL exec and job.

- Operator controls. These are GUI components that allow an operator at the tester console to perform actions or view status.
- Host interface control. This control translates the Tester Control's API into standard messages sent to or received from a host. Examples of these standards are SECS II, defined by SEMI, and SEMF, defined by Teradyne.

A production interface also includes a handler driver, which has the equipment-specific information about how to operate a particular handler or prober. A driver is selected and loaded at run-time. IG-XL will include drivers for standard interfaces and commonly used equipment. It will also be easy for a customer to create a custom handler driver without requiring any changes to IG-XL.

Open Design Concept

An operator interface needs to be easily customizable; each customer expects to create their own, tailored to their factory floor. Tester software generally meets this need by providing basic display tools useful to most customers, then providing an API which lets customers create their own tools. But a customer creating a tool usually can't start by modifying a system one, because reproducing the system software development environment is difficult and expensive, and the interfaces required to make it work often aren't exported or documented.

The choice of Visual Basic makes a different design model possible. The VB development environment is both powerful enough to be used for system software development, and easy to use and inexpensive enough that customers can also use it.

IG-XL will include sample production interfaces which can either be used outright, or copied and customized. The standard software distribution will include source code and documentation for the operator controls, host interface controls, and handler drivers. By just buying Visual Basic, a customer will have the same power to create production interfaces as the IG-XL software group.

ActiveX Controls

*Overview*

ActiveX is a software technology from Microsoft for developing language-independent software components called controls. Using it you can create an individual control, say a bin display. The control is shipped as a binary file with both code and GUI information embedded, which can be added to any development environment which supports ActiveX, regardless of the environment originally used to create the control.

Prior to Visual Basic V5.0, ActiveX controls were created using C++ (where they were called OLE custom controls). The C++ interface to ActiveX is difficult to use and requires an expert Microsoft C++/MFC programmer. VB 5.0 added the capability to create and use ActiveX controls much more easily, making the technology available to a broader range of programmers.

*Properties, Events, and Methods*

A feature provided in a traditional C/C++ library consists of class definitions, function calling conventions, and, if it's poorly designed, global variables. An ActiveX control interface is defined by properties, events, and methods.

A method is just a Visual Basic function you can call in the control. The function can take arguments and return a value, and is analogous to a function definition in a C/C++ library.

A property is basically a global variable in the control, with access functions provided to get and/or set its value. Properties can be made programmable at design time or run time, and VB automatically handles saving programmed property values as part of the production interface executable.

An event is a signal initiated by the control. The container (the production interface) can include a handler for the event. For example, the Tester Control includes an event called Test Complete which is sent when a job run is completed. The production interface can have a handler for this event which will be called automatically when this event occurs.

TESTER CONTROL

The Tester Control is the API to the tester. It serves as the single connection point between IG-XL and the rest of the world. Through it other controls can load and run programs and receive results. A production interface must contain exactly one tester control. The Tester Control interface will be documented for customers, but it will not be shipped as source code, because its connection to Excel and the exec is not intended to be exposed to general users.

Properties:
- Program name
- Program status – Loaded, validated, running, at trap
- DIB ID
- Probe card ID
- Bin results
- Engineering mode password
- Lot ID
- Wafer coordinates
- Operator name
- List of active sites – Map of sites currently being tested.
- Max sites – Number of sites in the program's channel map.
- Calibration status
- Program handle – Allows arbitrary calls between the program and user controls.

Events:
- Operator logged on/off
- Load started
- Load complete
- Load aborted
- Test started
- Test complete
- Test aborted
- Calibration start
- Calibration done
- Calibration aborted
- Start new lot
- End of lot
- Start wafer
- End of wafer
- Job deleted Methods:
- Operator logon/logoff
- Load a test program

- Delete a test program
- Start a lot
- End a lot
- Test a single device
- Loop on failure (for verifying continuity)
- Retest
- Configure for a handler/prober
- Enable/disable starts from a handler/prober
- Activate/deactivate a site
- Abort

OPERATOR CONTROLS

Handler Control

The handler control lets an operator select a handler from a menu of available handler drivers, connect it, and enable it.

Properties:

- Handler driver handle

Methods:

- Select handler driver
- Connect handler
- Disconnect handler
- Enable handler
- Disable handler

Sites Control

This control displays the number of sites in the job's channel map, and allows activating and deactivating specific sites for testing.

Bin Display

Shows the last bin result on a particular site.

Start Button

This control is a button which starts a job run.

Yield Monitor

The yield monitor control monitors the pass/fail results from devices on a site and tracks yield. It provides a graphical display of yield over time, and includes programmable yield limits that will cause events if tripped.

Properties:

- Site – which site the display will monitor
- Devices per cell – number of devices grouped together in a cell.
- Number of cells – how many cells are tracked.

26

- Cell count – how full the cell is
- Cell yield – The yield number for a particular cell of devices
- Cell display enabled – displays a bar graph of cell yields
- Cumulative display enabled – displays a line graph of cumulative yield through cells
- Chart layout – horizontal or vertical
- Alarm high limit – yield threshold at which to issue the alarm high event.
- Alarm low limit – yield threshold at which to issue the alarm low event.

Events:
- Yield alarm high
- Yield alarm low

Methods:
- Reset – Clears all cells.

HANDLER DRIVERS

The design of handler drivers in IG-XL is a major departure from what was done in VTD and ICD. The handler/prober support for these testers consists of a single, highly configurable library which attempts to support all possible equipment. This has proved to be difficult for customers to use. Configuring any particular piece of equipment is complicated because the interface has many programmable controls, only some of which are necessary. If a new handler requires a feature not available in the library, a system software update is required which can't be done by the customer. And the library is bug-prone, since any change to support new handlers risks introducing bugs in preexisting ones.

Driver Model

In IG-XL, each handler will have its own driver, containing only the code necessary to operate that specific handler. At run time, the driver required to operate the handler in use is dynamically loaded into the production interface. This has important advantages over the VTD/ICD approach:

- Since each driver module has only the code it requires, it is much smaller and simpler.
- The Visual Basic environment makes it easy for the Teradyne field organization or customers themselves to create a new driver without requiring support from the factory software group. IG-XL will include a number of drivers which can be copied as starting points.
- There is little risk that Teradyne software development will cause bugs, unlike with a single library which must be continually changed to add new features.

Built-In Drivers

IG-XL will provide a library of handler drivers which customers can either use directly or as a base for developing a new driver. We will provide the following drivers:

- P849. This is an IEEE standard for communication with a handler or prober over an RS232 interface. Within Teradyne it is sometimes called RDP. Any peripheral which conforms to this standard will be able to use the built-in driver without modification.
- SECS II / HSEM (Handler Specific Equipment Model). This is a SEMI standard for the interface to semiconductor handling equipment under the SECS II communications standard. This driver will support any equipment conforming to the spec.
- Specific handlers/probers commonly used by Teradyne customers (list to be determined).

Developing a Driver

To develop a new driver, you will usually start by copying one of IG-XL's drivers. The driver consists of a VB form which contains, at a minimum, a Handler Tester Control and calls to a communications interface. The Handler Tester Control defines the interface to IG-XL. User-defined code in the form uses the control's properties, events, and methods and programs the handler appropriately through the communications interface.

Figure 3 shows the structure of a handler driver.

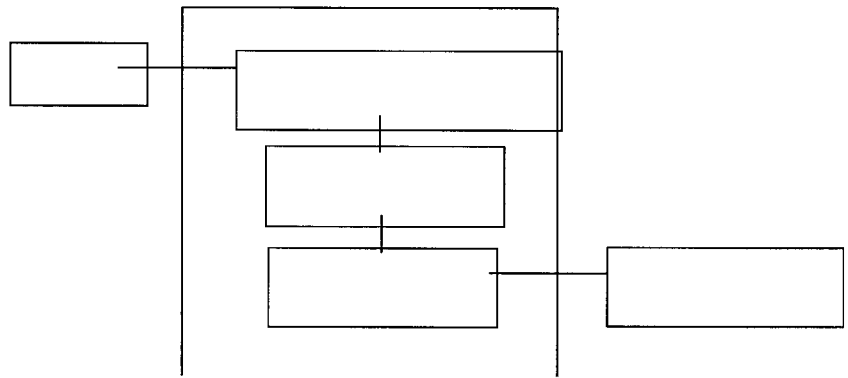

*Figure 2: Handler Driver Internals*

*Handler Tester Control*

The Handler Tester Control is an ActiveX control supplied by IG-XL which defines the interface to any handler. This serves as the single connection point between the handler driver and the rest of IG-XL. Anything containing this control can be dropped into a production interface and used as a handler.

Properties:
- Enabled
- Connected
- Bin results
- ErrorCode
- ErrorMessage
- DutID
- HandlerProberID
- OutputTubeStatus (handlers only)
- InputTubeStatus (handlers only)
- WaferStatus (probers only)

- InputCassetteStatus (probers only)
- Xcoord (probers only)
- Ycoord (probers only)

Events:
- Test Complete
- Enabled
- Disabled
- Connected
- Disconnected
- Wafer Complete (probers only)

Methods:
- Start test
- Enable handler
- Disable handler
- Connect handler
- Disconnect handler
- WaitForStart
- BinDispatch
- LoadSetup
- SendCommand
- SendRequest
- BreakContact (handlers only)
- MakeContact (handlers only)
- LoadWafer (probers only)
- UnloadWafer (probers only)
- ProbeWafer (probers only)
- AbortProbing (probers only)
- MoveToAbsoluteDie (probers only)
- MoveRelativeDie (probers only)
- MoveRelativePosition (probers only)
- MoveTowardContact (probers only)
- MoveAwayFromContact (probers only)
- MoveToGivenHeight (probers only)
- AssignGoodDieBins (probers only)
- AssignLogicalInkCodes (probers only)

*Communications Interface*

The communications interface defines the network transport layer between the tester and any peripheral. The handler/prober driver uses one or more of these interfaces to do actual reads and writes to and from the handler or prober.

We intend to support five interfaces:

- RS232. This is the standard serial interface. Microsoft provides a serial port controller with Visual Basic, and we hope to use this. We also have a more sophisticated, multithreaded control developed by Ed Gilbert.
- GPIB. This is a standard parallel interface widely used by test and measurement instrumentation. We hope to buy a PC GPIB interface from National Instruments.
- Dedicated parallel. This is a special parallel interface designed explicitly for fast tester to handler communication, where each wire performs a specific test function (not the parallel interface on a PC). VTD produces a parallel interface controller product which connects to an RS232 port in the computer and produces the necessary parallel signals; we hope to use this box as our support for parallel interfaces.
- Ethernet. Ethernet interfaces are becoming available on newer equipment, and we will need to support it. There is no plan for this as of yet.
- Parallel serial combination. Some machines include both a dedicated parallel interface for speed, and an RS232 port for more complicated communications when required. Since a handler driver can communicate through any or all of the above interfaces, supporting this requires no special work.

It will be convenient if the communications interface is an active ActiveX control, but this is not required. It can be a C/C++ DLL, or anything else callable from Visual Basic code.

Handler Driver Wizard

Windows software includes the concept of "Wizards" which get you started on a development task by asking a series of questions about what you want to do, then automatically creating a project with skeleton code which is filled in by hand to create the project. This makes it easy for the beginner to get started on a project, and even experienced driver writers get a convenient head start on writing their code.

We will create a Handler Driver Wizard to facilitate handler driver development. This would ask questions like:

- Driver for a handler or prober?
- What communications interface will it use?
- Is it a parallel test handler? How many sites?
- Number of bins supported?

Testing a Driver

Testing a production interface typically requires that a working test program and tester be available. This limits being able to have a parallel development effort between the production software and test program software.

The modular design of the IG-XL production software allows testing of a production interface and new handler driver to happen independently. Standard PC cards are available that let any PC communicate directly with a handler, without any tester present. A special software test harness will be provided which connects to the Tester Control instead of Excel. The harness will have a mini-exec that can seem to load and run a program and return random or preprogrammed bin results.

This would allow the engineer developing a production interface to perform a high degree of testing with simply a laptop with IG-XL installed, the handler itself, and an interface card.

HOST INTERFACE CONTROLS

On the production floor, a tester is typically connected to a host which monitors tester status, collects test results, and can control the testing process directly The IG-XL production software will support this through a host interface as shown in Figure 3.

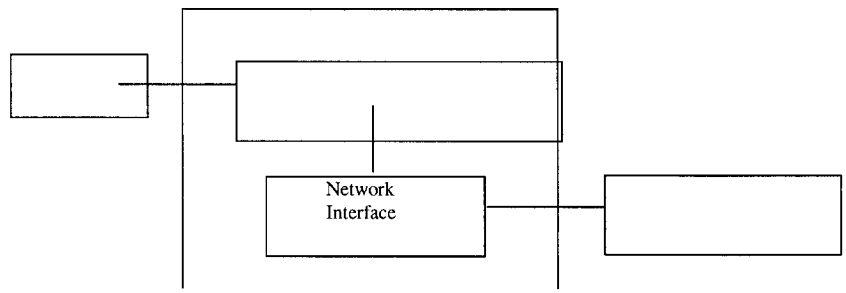

*Figure 3: Host Interface Control Internals*

There are two parts to the host interface. The Host Message Control is responsible for translating the IG-XL Tester Control API into messages in a standard format that can be understood by the host. The Network Interface does the actual network communication with the host machine.

Host Message Controls

The Host Message Control is an ActiveX control which listens to the Tester Control's events, and can execute its properties and methods. When a Tester Control event is received that requires a message to the host, it produces a host message describing the event and raises a "message ready" event. When a message is received from the host via a "message received" method, it accesses the appropriate Tester Control methods and properties to implement the request.

Properties:

- Enabled – the control can be disabled to suspend sending messages.

Events:

- Host message ready – The tester has a message to send to the host. An event handler in the production interface transmits the message over the network.

Methods:

- Do host message – The production interface has received a host message via the network interface which needs to be processed.

Two specific Host Message Controls will be provided with IG-XL:

- SEMF (Standard Event Message Format). This is a standard developed by Teradyne. It consists of text messages mainly sent from the tester to the host to report its status.

- SECS II / TSEM. SECS (SEMI Equipment Communications Standard) is a standard describing the details of messaging between a host and any semiconductor equipment. TSEM (Tester Specific Equipment Model) descibes additions to the standard which are specific to test equipment.

Network Interface

The interface to the network is handled by code in the production interface which interacts with the Host Message Control. Windows NT includes several options for communicating with the host:

- Winsock control. Visual Basic includes a standard ActiveX control for socket communication using TCP to any node on the network that supports sockets.
- RPC (Remote Procedure Call). This standard allows one computer to execute subroutine calls on another machine on the network. This is not as easy to use from Visual Basic as a socket, but gives us an escape to let a production interface do anything it needs to on the network.
- Distributed ActiveX. Within a Windows operating system environment, ActiveX controls on different machines can call each other directly, as easily as they communicate in-process. We have not yet researched this possibility thoroughly.

PROJECT LIST

Production User Controls
- Tester Control
- Sites control, bin display, handler control, start button
- Yield monitor Host Communications
- SEMF Host Message Control
- SECS II / TSEM Host Message Control Handler Drivers
- Handler tester control
- P849 driver
- SECS II / HSEM driver
- Specific handler/prober #1
- Specific handler/prober #2
- RS232 interface
- GPIB interface
- Ethernet interface
- Handler driver wizard
- Test harness Example Production Interfaces
- Sample #1
- Sample #2

These projects will be shipped as a standard part of IG-XL, and will include source code to serve as examples in case custom development is required.

What is claimed is:

1. A semiconductor test system comprising, a software control system, a library of self-contained control objects, an operator window, one or more of said self-contained control objects adapted to create a production interface to said software control system, said production interface having 1) a self-contained tester control for providing an application programming interface to said software control system and 2) self-contained operator controls that provide an interface between said operator window and said self-contained tester control, said self-contained operator controls in said library being "drag and drop" controls adapted to be "dragged and dropped" into said operator window.

2. The semiconductor test system of claim 1 in which said self-contained objects in said operator window all communicate with each other.

3. The semiconductor test system of claim 2 in which each self-contained control object is designed to operate such that at the time of initialization each self-contained control object will search for other self-contained control objects in the window and establish a communication link to every other self-contained control object such that each self-contained control object can talk to each other self-contained control object.

4. The semiconductor test system of claim 3 in which said self contained controls are ActiveX controls.

5. The semiconductor test system of claim 4 in which said ActiveX controls are programmed in the Visual Basic programming language.

6. The semiconductor test system of claim 2 in which said self contained tester control object and said self contained operator control objects are in said operator window and communicate with each other.

7. The semiconductor test system of claim 1 in which said operator self-contained ActiveX controls in said operator window all communicate with each other.

8. The semiconductor test system of claim 6 in which each ActiveX control is adapted to operate such that at the time of initialization each ActiveX control will search for other ActiveX controls in the window and establish a communication link to every other ActiveX control such that each ActiveX control can talk to each other ActiveX control.

9. A semiconductor test system comprising, a software control system, a library of ActiveX controls, an operator window, one or more of said ActiveX controls adapted to create a production interface to said software control system, said production interface having 1) an ActiveX tester control for providing an application programming interface to said test program and 2) ActiveX operator controls that provide an interface between said operator window and said ActiveX tester control, said ActiveX operator controls in said library adapted to be "dragged and dropped" into said operator window.

10. The semiconductor test system of claim 9 in which said ActiveX controls in said operator window all communicate with each other.

11. The semiconductor test system of claim 10 in which each ActiveX control is adapted to operate such that at the time of initialization each ActiveX control will search for other ActiveX controls in the window and establish a communication link to every other ActiveX control such that each ActiveX control can talk to each other ActiveX control.

12. The semiconductor test system of claim 11 in which said ActiveX controls are programmed in the Visual Basic programming language.

13. A semiconductor test system comprising, a semiconductor tester, a test development and execution program for providing semiconductor device data parameter to said tester, an executive for initiating a test by said test development and execution program, a library of ActiveX controls, one or more of said ActiveX controls adapted to create a production interface to said executive, said production interface having 1) an ActiveX tester control for providing an application programming interface to said executive and 2) ActiveX operator controls that provide an interface between an operator window and said ActiveX tester control, said ActiveX operator controls in said library adapted to be "dragged and dropped" into an operator window, said ActiveX operator controls in said operator window all communicating with each other.

14. The semiconductor test system of claim 13 in which each ActiveX control is adapted to operate such that at the time of initialization each ActiveX control will search for other ActiveX control on the window and establish a communication link to every other ActiveX control such that each ActiveX control can talk to each other ActiveX control.

15. The semiconductor test system of claim 14 in which said ActiveX controls are programmed in Visual Basic programming language.

16. A semiconductor test system adapted to work with one or more different handlers, said handlers for positioning a semiconductor device under test comprising, a library of handler drivers, each said handler driver adapted to work with a different handler, a production interface adapted to access said library, said production interface 1) having a tester self-contained control object for providing an application programming interface to said handler drivers and 2) having a self-contained operator control objects that provides an interface between an operator window and said self-contained tester control object, said self-contained operator control object allowing an operator to select a handler driver from said library of handler drivers.

17. The semiconductor test system of claim 16 in which each handler driver has a self-contained handler tester control object serving as the interface between said handler and said self-contained tester control object.

18. The semiconductor test system of claim 17 having a communications interface defining the communications network layer between said handler and said handler tester control object.

19. The semiconductor test system of claim 18 in which said handler tester control object, said tester control object and said operator control object are ActiveX controls.

20. The semiconductor test system of claim 19 in which said ActiveX controls are written in the Visual Basic programming language.

21. A semiconductor test system comprising, a tester, a handler for positioning a semiconductor device to be tested by said tester, said handler being one of a plurality of handlers adapted to work with said test system, a library of handler drivers, each said handler driver adapted to work with a different handler, a production interface adapted to access said library of handler drivers, said production interface 1) having an ActiveX tester control for providing an application programming interface to said handler drivers and 2) having an ActiveX operator control that provides an interface between an operator window and said ActiveX tester control, said ActiveX operator control allowing an operator to select a handler driver from said library of handler drivers.

22. The semiconductor test system of claim 21 in which each handler driver has an ActiveX handler tester control serving as the interface between said handler and said ActiveX tester control.

23. The semiconductor test system of claim 22 having a communications interface defining the communications network layer between said handler and said ActiveX handler tester control.

* * * * *